United States Patent [19]
Freeman, deceased et al.

[11] Patent Number: 5,140,193
[45] Date of Patent: Aug. 18, 1992

[54] PROGRAMMABLE CONNECTOR FOR PROGRAMMABLE LOGIC DEVICE

[75] Inventors: Ross H. Freeman, deceased, late of San Jose, by Dennis Hersey, executor; Khue Duong, San Jose; Hung-Cheng Hsieh, Sunnyvale; Charles R. Erickson, Fremont; William S. Carter, Santa Clara, all of Calif.

[73] Assignee: Xilinx, Inc., San Jose, Calif.

[21] Appl. No.: 499,759

[22] Filed: Mar. 27, 1990

[51] Int. Cl.$^5$ .............................................. H03K 17/00
[52] U.S. Cl. .................................... 307/465; 307/243; 307/468
[58] Field of Search ................. 307/243, 465, 468–469, 307/448, 202.1

[56] References Cited

U.S. PATENT DOCUMENTS

| | | | |
|---|---|---|---|
| 4,857,774 | 8/1989 | El-Ayat et al. | 307/468 X |
| 4,866,432 | 9/1989 | Goetting | 307/465 X |
| 4,876,466 | 10/1989 | Kondou et al. | 307/465 |
| 4,910,417 | 3/1990 | El Gamal et al. | 307/465 |

Primary Examiner—David Hudspeth
Attorney, Agent, or Firm—Edel M. Young; Bradley A. Greenwald; Alan H. MacPherson

[57] ABSTRACT

A structure especially useful in a configurable logic array includes a plurality of conductive interconnect lines located along the perimeter of a logic array chip. Lines running from exterior pins or pads can be used by a programmable interconnect circuit to control signals applied to these interconnect lines. In particular, both the signal and the complement of the signal can be used by the programmable interconnect to control application of a supply voltage to an interconnect line. A second supply voltage is applied through a resistor to the interconnect line with the result that the interconnect line will carry a logical signal representing a logical function, for example AND, of a selected set of input signals or their complements. Lines running from points interior to the configurable logic array chip may also contribute to the signal generated on an interconnect line. In one embodiment, bidirectional programmable interconnect circuits allow the input pins to function as either input or output pins. An application of the decoder circuit is described for use with a latch as a data-/address demultiplexer.

29 Claims, 7 Drawing Sheets

PROGRAMMABLE CONNECTOR FOR PROGRAMMABLE LOGIC DEVICE

A portion of the disclosure of this patent document contains material which is subject to copyright protection. The copyright owner has no objection to the reproduction by anyone of the patent document or the patent disclosure, as it appears in the Patent and Trademark Office patent files or records, but otherwise reserves all copyright rights whatsoever.

FIELD OF THE INVENTION

This invention relates to large integrated circuits, more particularly to programmable logic devices.

BACKGROUND

Prior art programmable logic devices can perform diverse logic functions. These functions include computing combinatorial logic functions such as AND, NAND, XOR, as well as storing such logic functions. Further, particular inputs can be selected from multiple inputs to a chip. U.S. Pat. No. 4,870,302 describes an invention of Xilinx, Inc., assignee of the present invention, for performing such functions. U.S. Pat. No. 4,706,216 describes a logic element used by Xilinx, Inc. to generate logic functions. These two patents are incorporated herein by reference. Products made as described in the above two patents are general and powerful, able to perform selectable logic functions of many variables and able to be reprogrammed by a user to change which logic functions are generated. Devices made by Xilinx, Inc. are described in "*The Programmable Gate Array Data Book*," available from Xilinx, Inc., 2100 Logic Drive, San Jose, Calif. 95124, incorporated herein by reference.

In order to direct the signals around a logic array chip to a particular logic element which will perform the desired function, it may be desired to buffer a signal before placing it onto an interconnect line. This is particularly true of signals coming from off the chip or going off the chip. U.S. Pat. No. 4,855,619 discloses a structure for controlling placement of signals from a plurality of lines onto another line, with buffering if the line is of sufficiently high capacitance to need buffering. Signals placed onto this interconnect line may be generated by a logic element of the type described in U.S. Pat. No. 4,706,216.

Some simple logic functions do not require the general and powerful abilities of the configurable logic element described in U.S. Pat. No. 4,706,216. Further, such simple logic functions might be used together with other more complex functions for which the full abilities of a configurable logic array chip are needed. One such simple function is the AND function. To perform this function quickly, manufacturers provide a wide wired AND gate such as shown in FIG. 1. Suppose that each of the transistors is N-channel and that the inputs $I_1$-$I_3$ to the function are applied through inverters $INV_1$-$INV_3$ to the gates of transistors $N_1$-$N_3$ respectively. When any of transistors $N_1$-$N_3$ is turned on by a low input signal on $I_1$, $I_2$, or $I_3$, interconnect line IC will be pulled to ground, generating a logical 0 output signal. Only when all inputs $I_1$-$I_3$ are high will all transistors $N_1$ through $N_3$ be off so that resistor $R_1$ can pull the interconnect line IC high to produce a logical 1 output signal. Thus the signal on interconnect line IC is the AND-function of the signals $I_1$-$I_3$.

Xilinx, Inc. provides a means of performing such a function in a configurable logic array chip. A buffer usable for such a purpose may be as shown in FIG. 2 and described in U.S. Pat. No. 4,855,619, which is incorporated herein by reference. The circuit of FIG. 2 can be programmed to present a high impedance to line LL1 when the value on line L1 is high and a low voltage when the value on line L1 is low. A high value in memory cell M61 turns on N-channel transistor T61, placing the signal from line L1 onto line L2. A low value in memory cell M41 turns on transistor T42 and turns off transistor T41 placing the signal from line L1 into inverter B41 which puts the complement of the signal on line L1 onto the gate of transistor T32. Thus a high value of L1 turns off transistor T32, presenting a high impedance on line LL1 whereas a low signal on L1 turns on transistor T32 and is propagated through T32 to line LL1. A plurality of lines such as L1 and L3 can be connected this way to line LL1, which in combination with resistor R62 can generate the AND function.

While this more sophisticated wired-AND gate has many advantages, there are still some occasions where further flexibility is desirable. For example, in complex information processing applications it is sometimes desired to have more than one logical function of the same set of variables available simultaneously. Additionally, if the logic function of the complement of an input signal is required, that input signal will first have to be routed to a logic element where it will be inverted. Then the inverted signal will have to be routed back to line LL1 which will generate the AND function of the inverted input signal and other signals. Generating the complement of an input signal in this way has two disadvantages. Firstly, it slows down the speed of information processing. Secondly, it uses valuable resources in the interior of the chip which could otherwise be available for performing more complex functions.

SUMMARY OF THE INVENTION

According to the present invention, a circuit generates at least one logic function from selected ones of a set of signals, wherein the set of signals consists of a first subset of signals and a second subset made up of the complements of the signals in the first subset. The logic function is generated without using general purpose logic resources. The output signal or signals are generated quickly, preferably in a physically small portion of a logic array chip close to the edge of the chip.

For each of a group of input signals, the input signal, the complement of that input signal, or neither value can be used to control a transistor which applies a voltage or a high impedance to an interconnect line which holds the function. Transistors which, when on, apply a first voltage to the interconnect line are controlled by a programmable interconnect. The programmable interconnect causes a respective transistor to turn on in response to a high input signal, in response to a low input signal, or to remain off in response to either value of the input signal. The transistor, in turn, applies either the first voltage, for example ground, or a high impedance to an interconnect line on which the function is generated. Other transistors (or similar control means) also apply either the first voltage or a high impedance to the interconnect line. Means for applying a second voltage, for example a positive supply voltage, to the interconnect line only when no transistor is applying the first voltage, for example a pull-up resistor connecting the interconnect line to $V_{cc}$, are also provided.

Thus the first voltage is present on the interconnect line when any transistor is turned on, and the second voltage is present on the interconnect line when no transistor is turned on. Therefore, the interconnect line carries the combinatorial function of the set of signals selected by the means for programming.

In one embodiment, each programmable interconnect is separately programmable to select between responding to a signal, its complement, or neither.

In a wide function embodiment, a programmable interconnect turns on a corresponding transistor in response to a combinatorial function of a set of input signals. A plurality of transistors, each controlled by a set of input signals, is controlled to apply the first voltage to the interconnect line. Thus a function of many input variables may be provided without adding corresponding capacitance to the interconnect line.

A choice between the function generated on the interconnect line and the complement of the generated function can be made by selecting whether the generated function is inverted before being applied to an output line.

When the first voltage source is ground and the second voltage source is the positive voltage supply, each interconnect line provides the AND function of any selection of input signals or their complements. The AND function can be programmed to be independent of any particular input signal or its complement. In a preferred embodiment, the input and interconnect lines are available in close proximity, so the length of the input and interconnect lines is short and their capacitance small, thus allowing still faster operating speed.

BRIEF DESCRIPTION OF THE DRAWINGS

FIG. 10b shows logic functions which can be generated by the circuit of FIG. 10a.

DETAILED DESCRIPTION

Figure 1:
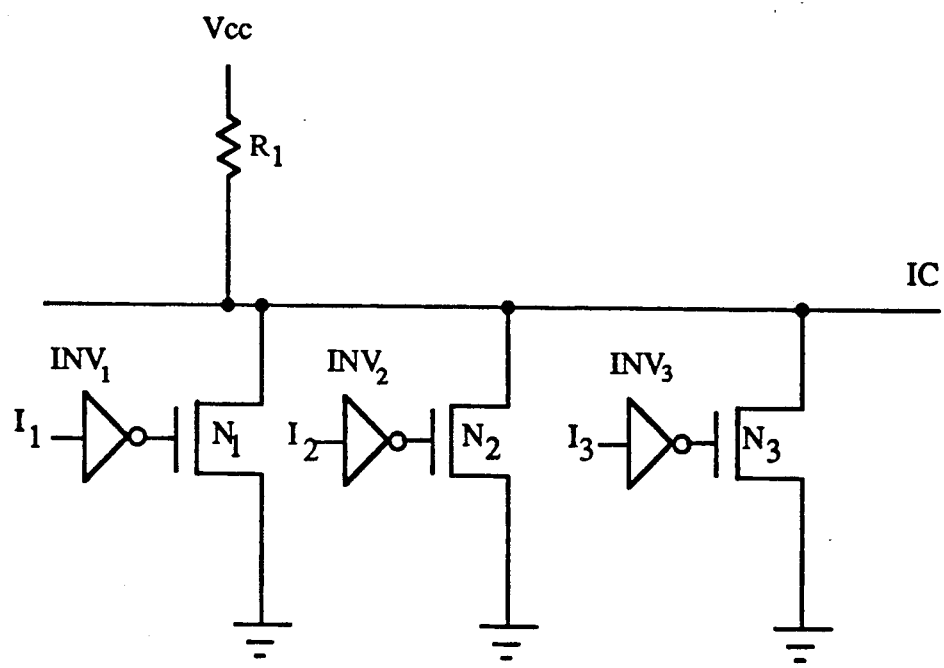
FIG. 1 shows a prior art programmable decoder.
Figure 2:
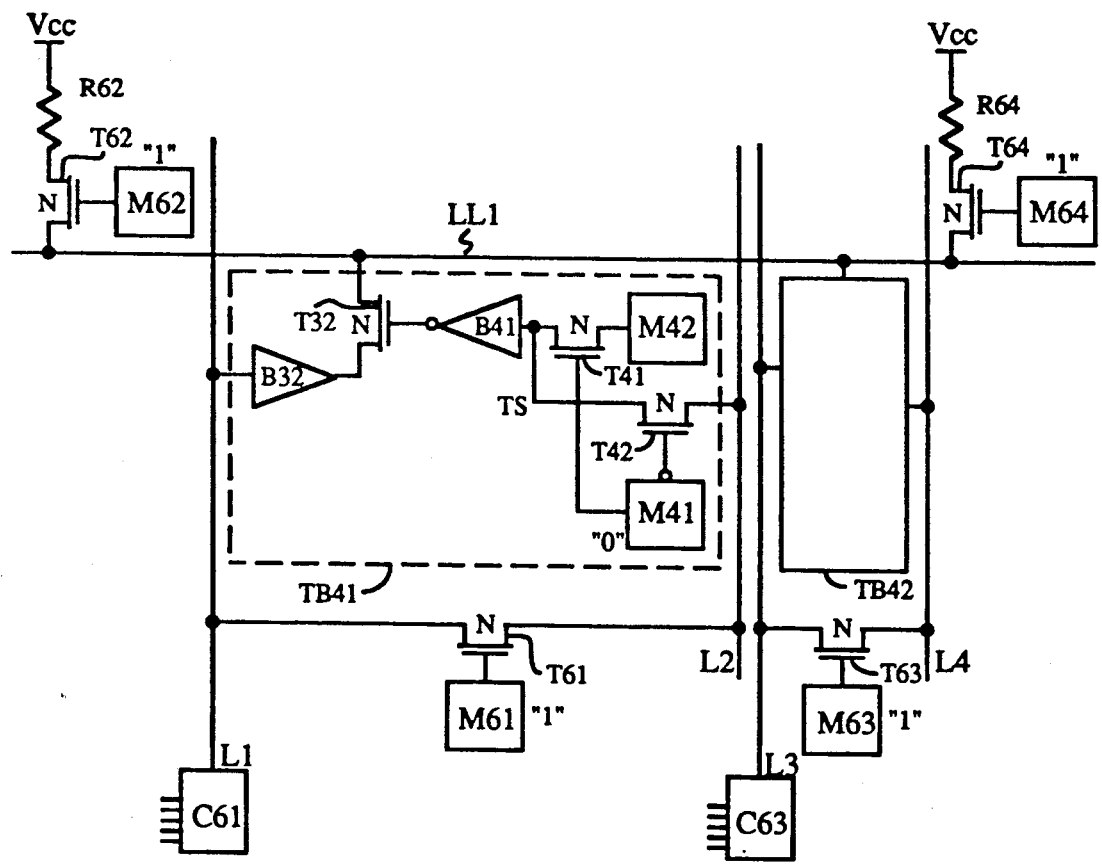
FIG. 2 shows a prior art implementation of a wired AND gate.
Figure 3:
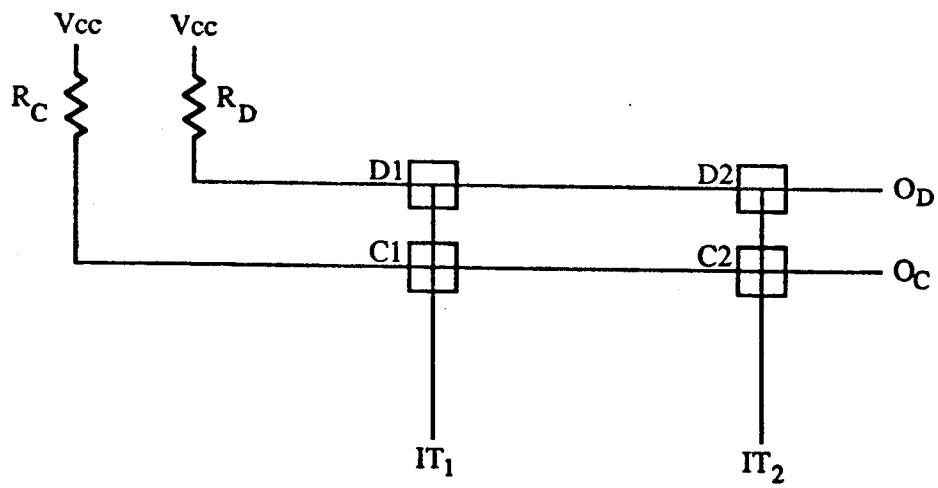
FIG. 3 shows a schematic representation of a programmable connector of the present invention.
Figure 4:
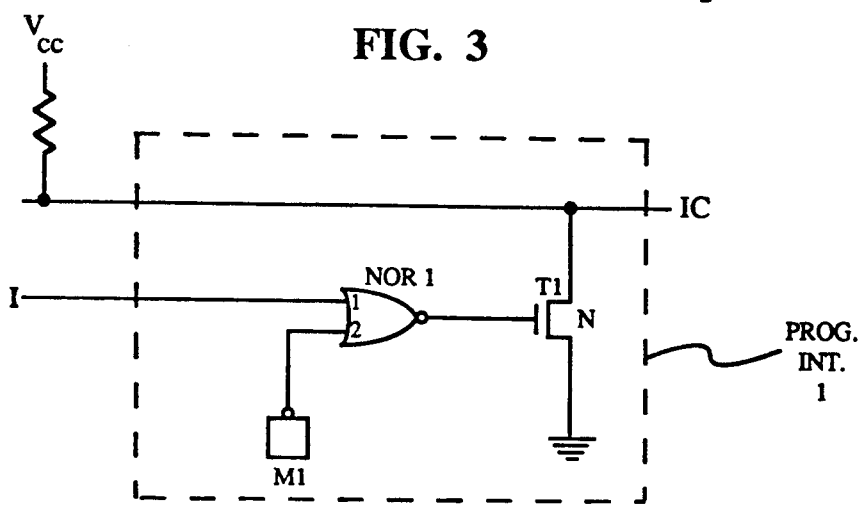
FIG. 4 shows one embodiment of the programmable connector of the present invention.

One embodiment of the invention is shown in FIG. 3. Two input terminals $IT_1$ and $IT_2$ and two interconnect lines $O_C$ and $O_D$ are shown. Each interconnect line is connected through a pull-up resistor $R_C$ or $R_D$ to voltage source $V_{cc}$. Each input line is connected by means of one programmable interconnect to each of the interconnect lines $O_C$ and $O_D$. Each programmable interconnect can use either the signal on the input line or the complement of that signal, or neither, for controlling whether a voltage is applied to the interconnect line. FIG. 4 shows one embodiment of a programmable connector. This programmable connector provides means for placing the signal carried by an input line I onto interconnect line IC. The programmable connector also provides means for effectively disconnecting input line I from interconnect line IC by providing a high impedance between the two lines. The interconnect line IC is provided with a pull-up resistor tied to a constant voltage. Thus, the circuit of FIG. 4 implements a programmable connector to provide the AND function. That is, line IC is pulled high if there are no low signals being placed on it, and it is pulled down if there is even one low signal being placed on it. Thus, programmable interconnect 1 is designed to provide a high impedance to IC to represent a high signal on input line I, and a low signal to IC to represent a low signal on input line I. If the signal carried on the input line I is to be included in the AND function, memory cell M1 is programmed to provide a low signal to input 2 of NOR gate NOR1. With input 2 forced low, NOR gate NOR1 will invert the signal carried on input line I. When input line I carries a low signal, NOR gate NOR1 will place a high signal on the gate of transistor T1 thus turning it on, and pulling interconnect line IC low. When input line I places a high signal on input 1 of NOR gate NOR1, NOR gate NOR1 will place a low signal on the gate of transistor T1. This turns T1 off and provides high impedance between interconnect line IC and input line I.

If the logic function generated on IC is to be independent of the signal on I, then memory cell M1 is programmed to provide a high signal to input 2 of NOR gate NOR1. This forces the output of NOR gate NOR1 low, which forces transistor T1 off. When T1 is off, a high impedance is provided between the interconnect line IC and the input line I, which effectively disconnects the two lines, thus making the logic function provided on IC independent of the signal carried on input line I.

Programmable interconnect 1 of FIG. 4 provides means for placing only the signal carried on input line I, and not the complement of that signal, onto interconnect line IC. To provide means for placing the complement of a signal as well as the signal itself, onto an interconnect line, a programmable interconnect 2 shown in FIG. 5 can be used. Programmable interconnect 2 provides two simple programmable interconnects as shown in FIG. 4 cascaded together, where the input signal is applied directly to NOR gate NOR2 and is passed through inverter 10 before being applied to NOR gate NOR3.

To control placement of a voltage onto interconnect line IC in response to the signal carried by input line I, memory cells M2 and M3 are programmed to ensure that section 52 turns on transistor T2 in response to a low signal on input line I, and that section 53 maintains transistor T3 off regardless of the signal on input line I.

Memory cell M2 is programmed to provide a low signal to NOR gate NOR2, which allows NOR gate NOR2 to provide the complement of input I to transistor T2. A high signal at input I thus results in a high impedance to IC to represent a high signal on input I and a low signal to IC to represent a low signal on input I. Memory cell M3 must be programmed to provide a high signal to NOR gate NOR3, thereby forcing the output of NOR gate NOR3 low and transistor T3 off regardless of the signal on input I. This effectively disconnects section 53 of programmable interconnect 2 from interconnect line IC.

If, however, a logical function of the complement of the signal carried on input line I is required, then memory cells M2 and M3 are programmed to turn section 53 on and section 52 off. Memory cell M3 is programmed to provide a low signal to NOR gate NOR3, which allows NOR gate NOR3 to provide a low output in response to a low signal on input I, in turn causing transistor T3 to provide a high impedance to interconnect line IC (by turning T3 off) to represent the low signal on input I. In this mode, NOR gate NOR3 will cause transistor T3 to apply a low signal to interconnect line IC (by turning T3 on) to represent a high signal on input I. When memory cell M3 provides a low signal, memory cell M2 must be programmed to provide a high signal to NOR gate NOR2 regardless of the state of input I, thereby forcing the output of NOR gate NOR2 low and transistor T2 off. This effectively disconnects section 52 of programmable interconnect 2 from interconnect line IC.

If it is required that the signal on interconnect line IC be independent of input signal I, then both of memory cells M2 and M3 are programmed to provide high signals, whereby transistors T2 and T3 provide high impedance to line IC regardless of the state of input signal I.

Figure 6:
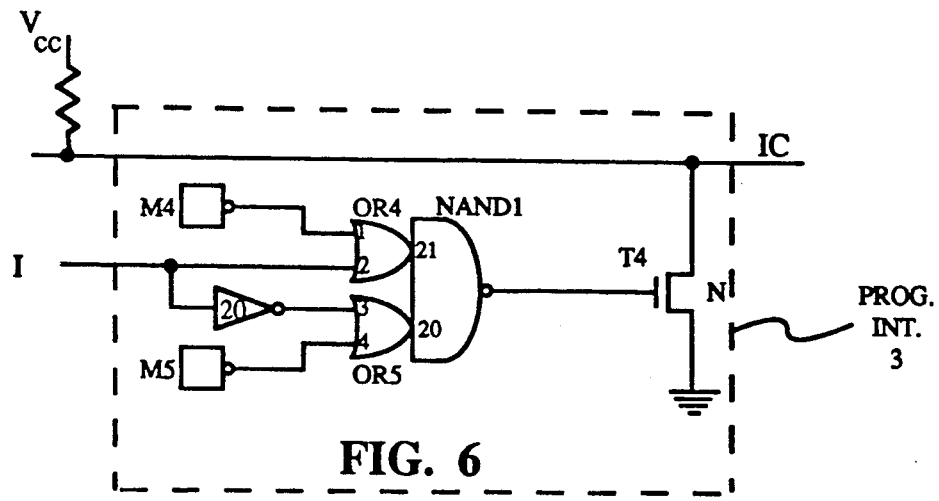
FIG. 6 shows yet another embodiment of the programmable connector of the present invention.

A third programmable interconnect is shown in FIG. 6. As does programmable interconnect 2, programmable interconnect 3 provides means for placing either a signal or its complement onto interconnect line IC. Also, like programmable interconnect 2, programmable interconnect 3 provides a high impedance to IC to represent a high signal (or a high complement signal) on input line I, and a low signal (or low complement signal) to represent a low signal on input line I. Programmable interconnect 3 is preferred, however, because it adds less capacitance to interconnect line IC than does programmable interconnect 2.

For the embodiment shown in FIG. 6, if an AND function of the input signal I is required, memory cell M5 is programmed to place a high signal on input 4 of OR gate OR5 and memory cell M4 is programmed to place a low signal on input 1 of OR gate OR4. This forces the output of OR gate OR5 high, which in turn forces the input 20 of NAND gate NAND1 high. With input 20 forced high, the output of NAND gate NAND1 will be determined by input 21, which receives the output of OR gate OR4. Since memory cell M4 is programmed to place a low signal on input 1 of OR gate OR4, the output of OR gate OR4 follows the input signal placed by input line I on input 2 of OR gate OR4. Since the output of OR gate OR4 is the input 21 of NAND gate NAND1, the output of NAND gate NAND1 will be the complement of the signal on input line I. Thus, for a high signal on input line I, transistor T4 will be turned off and a high impedance will be provided to interconnect line IC. For a low signal on input line I, transistor T4 will be turned on, and interconnect line IC will be pulled low.

If an AND function of the complement of the input signal is required, memory cell M4 is programmed to place a high signal on input 1 of OR gate OR4 which forces the output of OR gate OR4 high. This in turn forces the input 21 of NAND gate NAND1 high. With input 21 forced high, the output of the NAND gate NAND1 will place the complement of the signal on the other input 20 of the NAND gate onto the gate of T4. Memory cell M5 is programmed to place a low signal on input 4 of OR gate OR5 so that the output of OR gate OR5 follows the complement of the input signal carried by input line I, placed by inverter 20 on input 3 of OR gate OR5. Since the output of OR gate OR5 is the input 20 of NAND gate NAND1, the output of NAND gate NAND1 will turn transistor T4 off when input signal I is low, thereby providing a high impedance to interconnect line IC. Likewise, NAND gate NAND1 turns on transistor T4 when input signal I is high, thereby pulling down line IC. In this way the logic function provided by interconnect line IC will be a function of the complement of the signal on input line I.

Finally, if the function on interconnect line IC is to be independent of the input signal I, memory cells M4 and M5 are programmed to provide high signals to gates 1 and 4 of OR gates OR4 and OR5 respectively, thus applying high signals to both of inputs 20 and 21 of NAND gate NAND1, causing transistor T4 to be off regardless of the state of input signal I.

The determination of a specific logic function will be explained with reference to FIG. 3. Suppose that signal A is placed on input terminal $IT_1$ and signal B is placed on input terminal $IT_2$. Further suppose that interconnect line $O_C$ is required to carry the function A AND $\overline{B}$, and interconnect line $O_D$ is required to carry the function $\overline{A}$.

To generate the function A AND $\overline{B}$ on interconnect line $O_C$, programmable interconnect C1 and programmable interconnect C2 must be appropriately programmed. Programmable interconnect C1 is programmed (as discussed above) to represent the input signal carried by input terminal $IT_1$ on interconnect line $O_C$ (i.e. high impedance represents a high input signal; a low voltage represents a low input signal). Programmable interconnect C2 is programmed to represent the complement of the input signal carried by input terminal $IT_2$ to interconnect line $O_C$. In this way the interconnect line $O_C$ will carry the logical function A AND $\overline{B}$.

To generate the function $\overline{A}$ on interconnect line $O_D$, programmable interconnect D1 is programmed to represent the complement of the signal carried on input terminal $IT_1$ to interconnect line $O_D$. Programmable interconnect D2 is programmed to effectively disconnect interconnect line $O_D$ from input terminal $IT_2$ so that the signal on $O_D$ will be independent of both the signal and the complement on $IT_2$. In this way, the interconnect line $O_D$ will carry the logical function $\overline{A}$.

Figure 7:
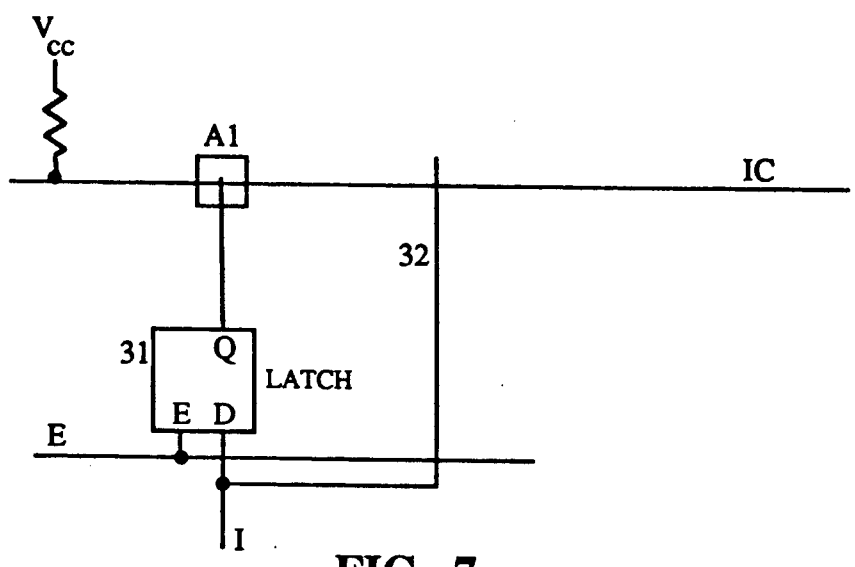
FIG. 7 shows a symbolic representation of a data/address demultiplexer using a latch with the programmable connector of the present invention.

One application of the programmable connector of the present invention is for use with the data/address demultiplexer shown in FIG. 7. Input line I carries a time multiplexed signal which part of the time represents an address, and part of the time represents data present at that address. Input line I is connected to the input port D of latch 31. An enable signal, typically generated off-chip, is applied to the enable port E of latch 31. The output port Q of latch 31 is connected to a programmable interconnect A1. When the signal applied to enable port E is high, the signal presented at input port D by input line I is passed to the output port Q of latch 31. Programmable interconnect A1 then passes the signal on Q, or its complement, or neither, to the interconnect line IC. This signal is part of an address which will be sent to the appropriate circuit element or set of circuit elements by interconnect circuitry to which interconnect line IC may be connected. While a particular value is latched into latch 31 (and typically other latches, not shown, which carry other parts of the address), a certain device will be enabled by the address. When the signal presented to E then goes low, the address is latched into latch 31, and the data on input line I (and other lines, not shown) which are demultiplexed at latch 31 (and other latches, not shown) can be sent to the addressed device (or to general interconnect circuitry which will then route the signal to the addressed device) by line 32 (and other data lines not shown).

In another embodiment using bi-directional programmable interconnects, a single pin can be used as either an input pin or an output pin.

Figure 8:
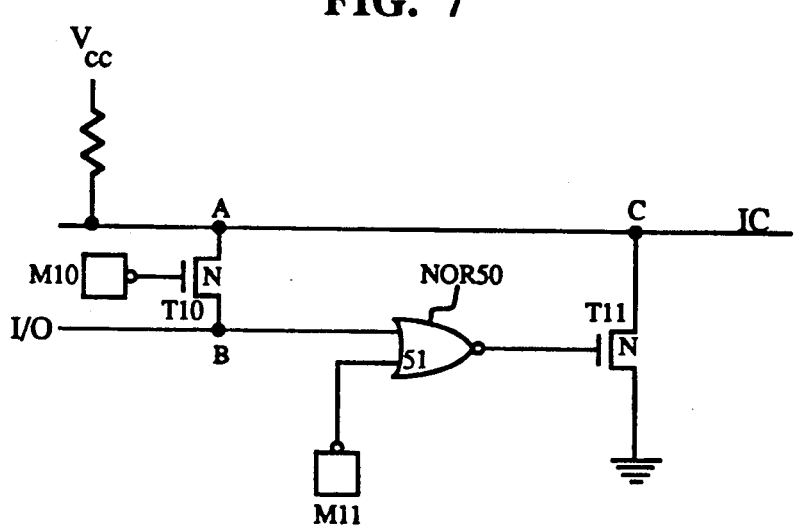
FIG. 8 shows a bidirectional programmable connector of the present invention.
Figure 9:
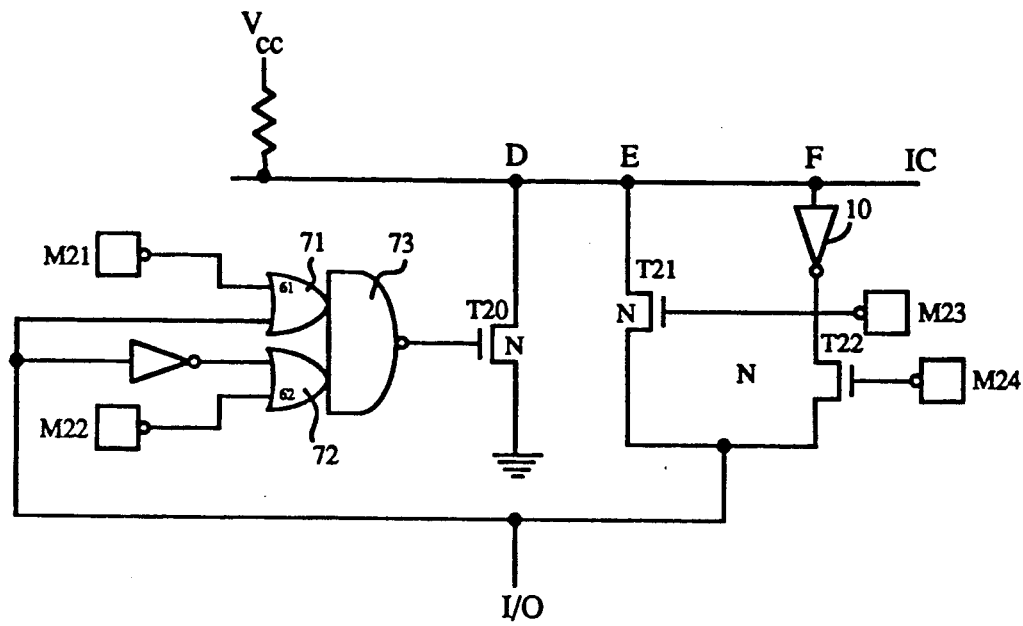
FIG. 9 shows another embodiment of a bidirectional programmable connector of the present invention.

Two examples of such bi-directional programmable interconnects are shown in FIGS. 8 and 9. The bi-directional programmable interconnect shown in FIG. 8 is structurally similar to the programmable interconnect 1 discussed earlier and shown in FIG. 4, except that the bi-directional programmable interconnect contains an additional memory cell M10 and an additional transistor T10. These two extra components of the bi-directional programmable interconnect make it possible to pass a signal either from input/output line I/O to interconnect line IC, or from the interconnect line IC to input/output line I/O or for input/output line I/O to be disconnected from interconnect line IC, and therefore independent of each other.

Thus for input/output line I/O to function as an output line, node A is connected to the input/output line I/O by programming memory cell M10 to turn transistor T10 on. Further, Node C is effectively disconnected from input/output line I/O by turning transistor T11 off. Transistor T11 can be turned off by programming memory cell M11 to place a high signal on input 51 which forces the output of NOR-gate NOR50 low.

When input/output line I/O is functioning as an input line, node C is used as discussed earlier. Node A is disconnected from input/output line I/O by programming memory cell M10 to turn transistor T10 off. Further, memory cell M11 is programmed to place a low signal on input 51 so that NOR gate NOR50 works exactly as NOR gate NOR1 does in the programmable interconnect of FIG. 4.

A more sophisticated bi-directional-programmable interconnect shown in FIG. 9 has three modes of operation. In the first mode, input/output line I/O functions as an output line, and the bi-directional programmable interconnect can pass a signal on an interconnect line or the complement of a signal on an interconnect line to an I/O line. In the second mode, input/output line I/O functions as an input line, and the bi-directional programmable interconnect can pass a signal on an I/O line or the complement of a signal on an I/O line to an interconnect line. In the third mode the bi-directional programmable interconnect can effectively disconnect an interconnect line from an I/O line by providing high impedance between the two lines.

Operation in the first mode, that is, when input/output line I/O is functioning as an output line, is as follows. Node E is used for routing a signal from interconnect line IC to line I/O. Node F is used to route the complement of the signal on interconnect line IC to line I/O. Node D is used in the input mode. For the output mode, node D is disconnected from the interconnect line by programming both memory cells M21 and M22 to place a high signal on inputs 61 and 62 of OR-gates 71 and 72, respectively. This forces the outputs of these OR gates high, which in turn forces the output of NAND gate 73 low, which turns off transistor T20. If the signal on interconnect line IC is to be placed onto input/output line I/O, then transistor T21 is turned on by memory cell M23 and T22 is turned off by memory cell M24. This allows passage of the signal on the interconnect line to input/output line I/O through transistor T21. If the complement of the signal on interconnect line IC is to be placed on input/output line I/O, then transistor T22 is turned on by memory cell M24 and T21 is turned off by memory cell M23. This allows the signal on interconnect line IC to be inverted by inverter 10 before being placed on input/output line I/O.

Operation in the second mode, where input/output line I/O is to function as an input line, is achieved by disconnecting both nodes E and F from the interconnect line. This can be done by programming memory cells M23 and M24 to turn off transistors T21 and T22, respectively, by placing a low signal on the gate of each transistor. Then, memory cells M21 and M22 are programmed as were memory cells M4 and M5 in FIG. 6.

Operation in the third mode, where input/output line I/O is independent of interconnect line IC, is achieved by programming memory cells M21 and M22 to place high signals on inputs to OR gates 71 and 72 and simultaneously programming memory cells M23 and M24 to place low signals on gates of transistors T21 and T22. With all three of transistors T20, T21, and T22 off, the programmable interconnect of FIG. 9 disconnects input/output line I/O from interconnect line IC.

Figure 5:
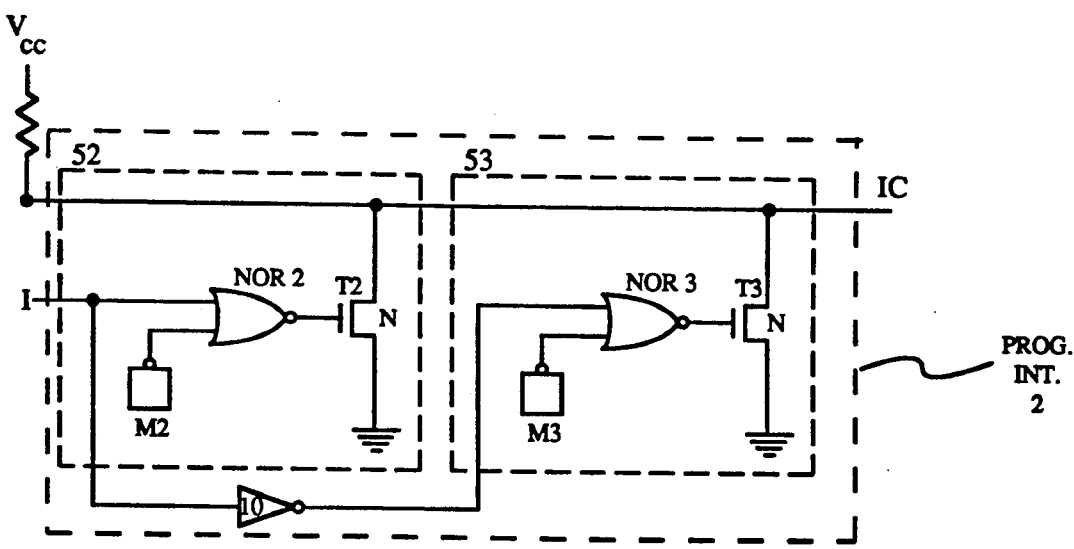
FIG. 5 shows another embodiment of the programmable connector of the present invention.
Figure 10A:
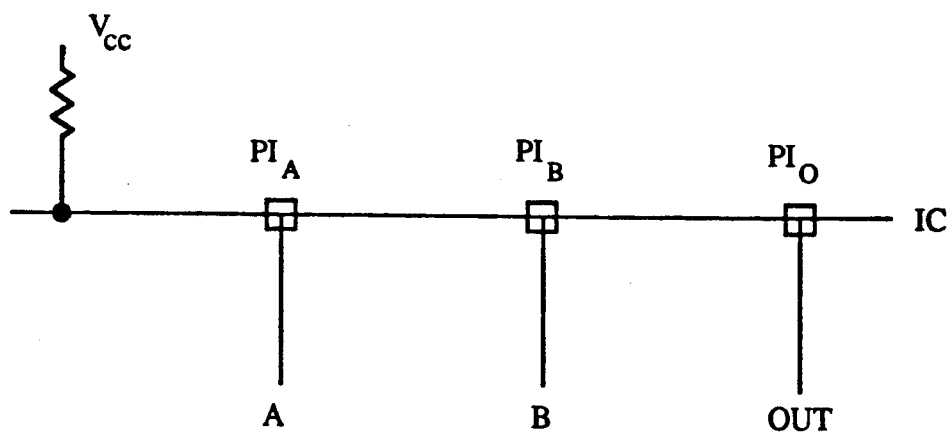
FIG. 10a shows a symbolic representation of a programmable connector in which input and output lines are provided.
Figure 10B:
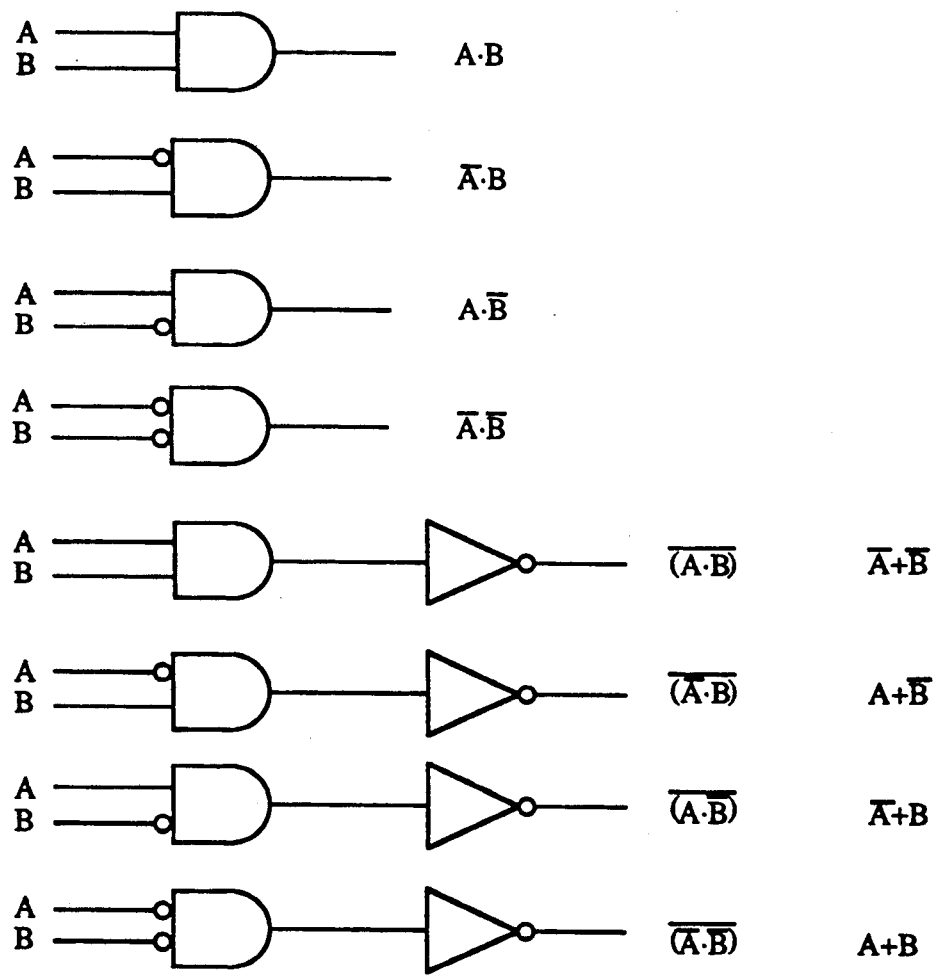

In addition, the bi-directional programmable interconnect of FIG. 9 also allows the programmable connector to generate additional logic functions. This is because when the input/output line I/O functions as an output line, the bi-directional programmable interconnect of FIG. 9 provides means for placing either the signal or the complement of the signal carried by interconnect line IC onto input/output line I/O. This ensures a structure parallel to the ordinary programmable interconnect wherein the signal carried by the input line, or the complement of that signal, can be placed onto the interconnect line. FIG. 10a shows a schematic representation of the circuit for generating functions of input signals A and B and placing a function of A and B onto output line OUT. Programmable interconnects $PI_A$ and $PI_B$ may be dedicated input interconnects as shown in FIGS. 5 and 6 or bidirectional interconnects such as shown in FIG. 9. Likewise, programmable interconnect P10 may be bidirectional as shown in FIG. 9 or may comprise only the output circuit elements shown on the right side of FIG. 9. FIG. 10b represents the set of functions which can be generated when the signal present on interconnect line IC can be inverted before applying to output line OUT. For the case where the signal on interconnect line IC is generated from input signals A and B, inverting of the output signal allows the following additional functions to be provided: $(A+\overline{B})$, $(\overline{A}+B)$, $(\overline{A}+\overline{B})$, and $(A+B)$. Moreover, these additional logic functions are generated without using any of the more general purpose logic resources located in the chip.

Figure 11:
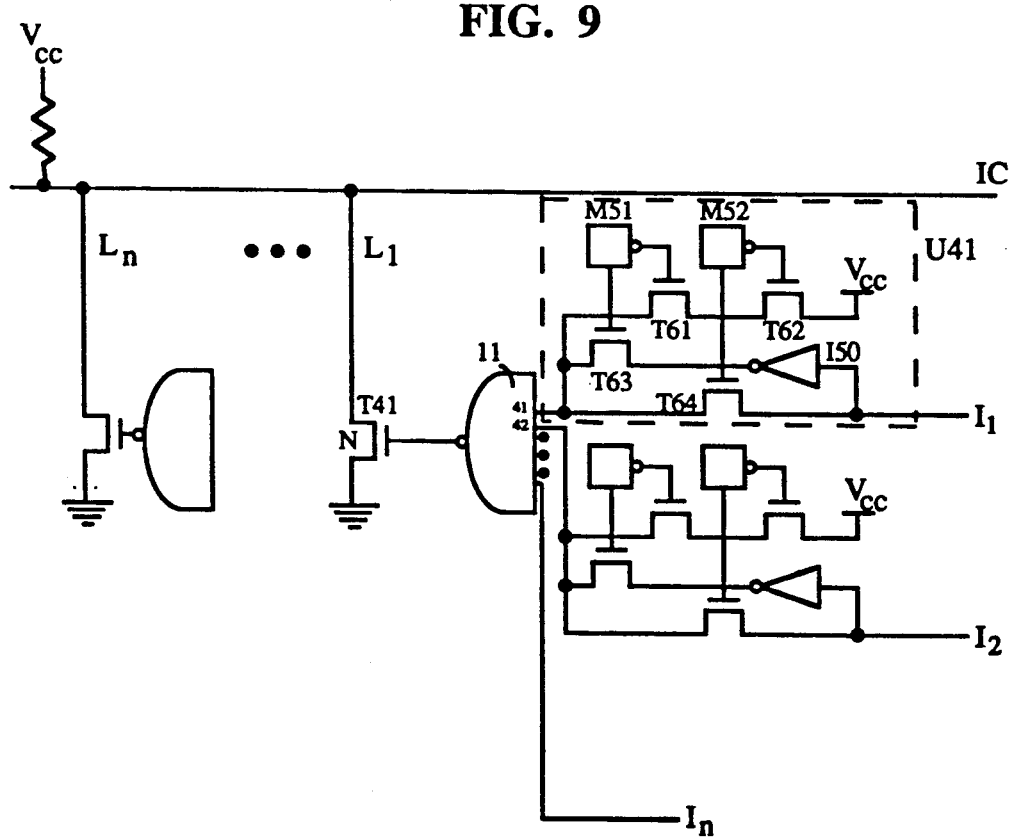
FIG. 11 shows an embodiment of the programmable connector especially useful for a high speed wide AND gate.

A further embodiment, shown in FIG. 11, allows implementing a much wider AND-gate without adding corresponding capacitance to interconnect line IC.

In the connector embodiment of FIGS. 4, 6, and 9, each input line required its own programmable interconnect. Each programmable interconnect adds some parasitic capacitance to the interconnect line IC. In the wider decoder of FIG. 11, there can be several input lines using the same programmable interconnect since the AND function of some subset of input signals and complements is used by a NAND gate to generate another AND gate input before reaching interconnect line IC. Since fewer programmable interconnects are required, there is less capacitance added to the interconnect line IC.

As shown in FIG. 11, different means for applying input signal to interconnect line IC are used. Each of the input lines $I_1$-$I_n$ is connected to an input of a NAND gate such as NAND gate 11 by means of two memory cells, four pass transistors, and one inverter arranged as shown in unit U41. NAND gate 11 controls a transistor T41. Depending on how memory cells M51 and M52 are programmed, either the signal on input line $I_1$ or its complement can be input to the NAND gate input terminal 41, or input line $I_1$ can be effectively disconnected from NAND gate 11. Disconnecting the input line $I_1$ is achieved by loading logical 0's into memory cells M51 and M52, thereby turning off both of transistors T63 and T64 and turning on transistors T61 and T62, allowing a high signal to be passed to NAND gate 11 through transistors T61 and T62. In this way, the signal on line $L_1$ can be the AND function of any combination of the signals or the complements of the signals on input lines $I_1$-$I_n$.

Further, additional lines such as line Ln, each with their own sets of input lines (not shown), can be connected to interconnect line IC. Interconnect line IC will provide the AND function of any combination of the signals or complements of signals on all of the input lines such as $I_1$-$I_n$ which in turn provide input to NAND gates for controlling lines $I_1$-$I_n$.

Figure 12:
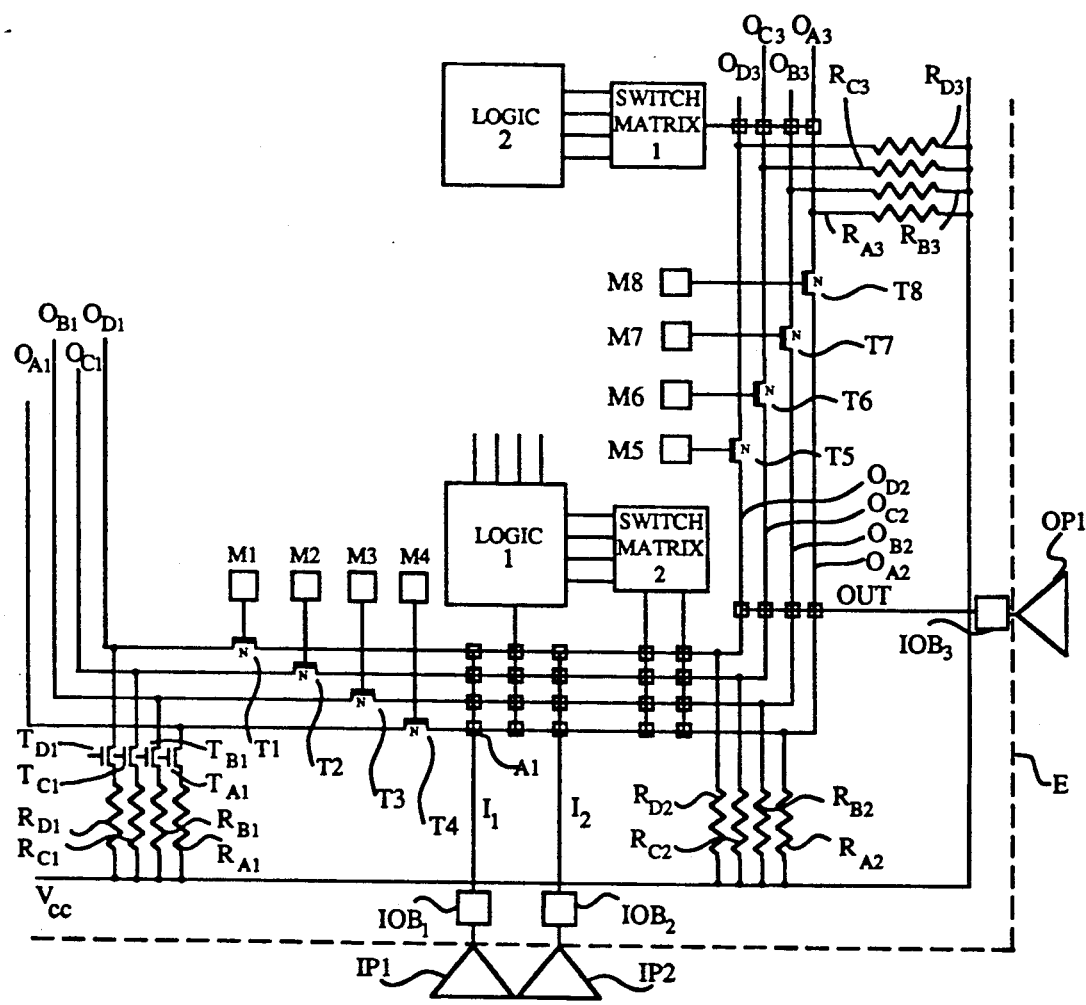
FIG. 12 represents the layout of the programmable connector in an integrated circuit chip with the connector located between the edge of the chip and logic elements internal to the chip, and having connections to both internal and external points.

An embodiment shown in FIG. 12 illustrates several more features of the invention. As shown in FIG. 12, the input and interconnect lines are placed between the edge E of the chip and logic blocks such as LOGIC 1 and LOGIC 2 interior to the chip. This way, the delay a signal experiences, for example, while traveling from input pins $IP_1$ and $IP_2$ through input/output buffers $IOB_1$, $IOB_2$, though programmable interconnects such as A1 to interconnect line $O_{A2}$, is minimized, thus minimizing capacitance and increasing the speed of the circuit. Further, the signal on an interconnect line OA, OB, OC or OD can easily be sent off the chip by simply routing it to an appropriate output line such as OUT and through an input/output buffer such as $IOB_3$ to an output pin such as $OP_1$.

The speed can also be improved by locating pass transistors or transmission gates along the interconnect lines $O_A$, $O_B$, $O_C$ and $O_D$. For example, if the logic functions of the signals on pins $IP_1$ and $IP_2$ will be used at LOGIC 2, then pass transistors or transmission gates T5–T8 controlled by memory cells M5–M8 are turned on so that the signal on the selected interconnect lines $O_{A2}$–$O_{D2}$ will be available to the switch matrix 1 interconnect leading to LOGIC 2. In this case, pass transistors or transmission gates T1–T4 are turned off, effectively separating interconnect line segments $O_{A1}$, $O_{B1}$, $O_{C1}$ and $O_{D1}$ from interconnect line segments $O_{A2}$, $O_{B2}$, $O_{C2}$ and $O_{D2}$. If the signal on an interconnect line is needed in close proximity to the input lines, for example at LOGIC 1 or OUT, pass transistors or transmission gates T5–T8 controlled by memory cells M5–M8 can also be turned off, further decreasing the length and thereby the capacitance of the interconnect lines $O_{A2}$–$O_{D2}$, and consequently the switching time of the signal.

Provision of pass transistors or transmission gates such as T1–T8 to segment the interconnect lines allows one chip to have a selectable number of separate decoders or other programmable connectors located around the perimeter of the chip. In order for each separable segment to operate as discussed, a pull-up resistor is connected to every segment of every interconnect line, as shown, so that each separate segment can provide both high and low voltages as required. For example resistor $R_{D1}$ is connected to segment $O_{D1}$, resistor $R_{D2}$ is connected to segment $O_{D2}$ and resistor $R_{D3}$ is connected to segment $O_{D3}$.

In order for a segment to operate as an interconnect line for transmitting a signal between I/O lines connected to the interconnect line, and not to operate as a function generator, some of the resistors, in this case resistors $R_{A1}$, $R_{B1}$, $R_{C1}$ and $R_{D1}$, shown in FIG. 12 are formed in series with pass transistors, $T_{A1}$, $T_{B1}$, $T_{C1}$ and $T_{D1}$ respectively. When a pass transistor is off, the corresponding pullup resistor is disconnected, thus allowing the interconnect line to pass a signal from one I/O line to another I/O line. For example, turning off transistors $T_{A1}$ and $T_4$ allows line segment $O_{A1}$ to serve as an interconnect line for input/output lines (not shown) connected to line segment $O_{A1}$. Also, if several segments are connected together it may be desirable to connect only one resistor to the connected set of line segments in order to save power, or conversely to connect more than one resistor in order to increase speed.

Further, the input signals can come either from input pins such as $IP_1$ or $IP_2$, or from circuitry in the interior of the chip, for example from switch matrix 1 or logic device LOGIC 1. Similarly, the generated logical functions can be sent directly to output pins such as $OP_1$, or routed to the general interconnect circuitry at the interior of the chip.

It is within the scope of the present invention to programmably divide lines running along the perimeter of a chip into any number of segments by using pass transistors or transmission gates to separate the segments. Likewise, the invention may provide segments which do not extend around the full perimeter, may provide segments within the interior of a chip, and may provide segments which extend from the perimeter to the interior of the chip. Any number of interconnect lines may be provided. It is further within the scope of the present invention to provide input lines which can connect to less than all the lines crossed. Also, not all input lines need have their complement signals readily available to the interconnect lines. It is further within the scope of the invention to provide bi-directional buffers so that input pins to which the buffers connect can be used as either input or output pins. Further, it is possible to implement other logic functions including OR, NAND, and NOR, just as the AND function which has been described, by changing the polarity of the voltages applied to the interconnect line or by adding inverters.

Further modifications will become obvious to those skilled in the art in light of the above disclosure and are also intended to fall within the scope of the invention.

What is claimed is:

1. A programmable connector for a programmable logic device comprising:
   at least one I/O line;
   at least one interconnect line;
   at least one programmable interconnect corresponding to one of said at least one I/O line and one of said at least one interconnect line, each of said at least one programmable interconnect comprising:
   means for applying a first voltage to said interconnect line;
   programmable control means for controlling said means for applying a first voltage, said programmable control means being programmable to at least a first state such that
   in said first state said means for applying a first voltage provides said first voltage to said corresponding interconnect line in response to a first signal on said corresponding I/O line and provides a high impedance to said corresponding interconnect line in response to a second signal on said corresponding I/O line;
   means for providing a second voltage to each of said at least one interconnect line on which there is no first voltage being placed by any of said means for applying a first voltage; and
   means for programmably applying one of a signal present on said interconnect line and the complement of said signal present on said interconnect line to one of said at least one I/O line.

2. A programmable connector as in claim 1 in which said at least one I/O line is a plurality of I/O lines, and one programmable interconnect corresponds to each of said I/O lines.

3. A programmable connector as in claim 1 in which said at least one interconnect line is a plurality of interconnect lines and one programmable interconnect corresponds to each of said interconnect lines.

4. A programmable connector as in claim 1 in which said at least one I/O line is a plurality of I/O lines, said at least one interconnect line is a plurality of interconnect lines, and at least one programmable interconnect corresponds to each of said I/O lines and at least one programmable interconnect corresponds to each of said interconnect lines.

5. A programmable connector as in claim 1, in which said at least one I/O line is a plurality of I/O lines, said programmable connector further comprising:
   means for programmably applying a signal present on one of said at least one interconnect line to one of said plurality of I/O lines, and
   means for programmably applying the complement of said signal present on said one of said at least one interconnect line to said one of said plurality of I/O lines.

6. A programmable connector as in claim 1 further comprising an external pin connected to at least one of said at least one I/O line.

7. A programmable connector as in claim 1 further comprising means for placing at least one signal generated internally to an integrated circuit onto at least one of said at least one I/O line.

8. A programmable connector as in claim 1 in which said programmable control means is further programmable to at least a second state such that
in said second state said means for applying a first voltage provides said first voltage to said corresponding interconnect line in response to said second signal on said I/O line and provides a high impedance to said corresponding interconnect line in response to said first signal on said corresponding I/O line.

9. A programmable connector as in claim 1 in which said programmable control means is further programmable to a state in which said means for applying a first voltage provides a high impedance to said corresponding interconnect line in response to both said first and second signals on said corresponding I/O line.

10. A programmable connector as in claim 1 or 8 in which said means for programmably applying can be programmed to apply a high impedance to said at least one I/O line.

11. A programmable connector as in claim 1 or 8 in which said at least one I/O line, said at least one interconnect line, and said at least one programmable interconnect are located between the edge of an integrated circuit and logic circuitry internal to said integrated circuit.

12. A programmable connector as in claim 1 or 8 further comprising a latch inserted between said I/O line and said programmable interconnect, said latch comprising a data port connected to said I/O line, an enable port, and an output port connected to said programmable interconnect, said output port being connected to said I/O line when a signal on said enable port has a first state and said output port being disconnected from said I/O line when a signal on said enable port has a second state, said output port providing to said programmable interconnect a signal related to a signal present on said I/O line when said signal on said enable port has had said first state.

13. A programmable connector for a programmable logic device comprising:
   a plurality of input lines;
   at least one interconnect line;
   at least one programmable interconnect, each corresponding to one interconnect line and corresponding to a plurality of said independent input signals, each of said at least one programmable interconnect comprising:
   means for applying a first voltage to said interconnect line; and
   programmable control means for controlling said means for applying a first voltage, said programmable control means being controlled by a programmable set of said independent input signals such that said means for applying said first voltage can be caused to apply said first voltage in response to a selected combination of said independent input signals; and
   means for providing a second voltage to each of said at least one interconnect line on which there is no first voltage being placed by any of said means for applying a first voltage.

14. A programmable connector as in claim 13 in which said plurality of input lines, said at least one interconnect line, and said at least one programmable interconnect are located between the edge of an integrated circuit and logic circuitry internal to said integrated circuit.

15. A programmable connector as in claim 13 further comprising means for placing at least one signal generated internally to an integrated circuit onto at least one of said plurality of input lines.

16. A programmable connector as in claim 13 further comprising a latch inserted between at least one of said plurality of input lines and said programmable interconnect, said latch comprising a data port connected to said I/O line, an enable port, and an output port connected to said programmable interconnect, said output port being connected to said one of said plurality of input lines when a signal on said enable port has a first state and said output port being disconnected from said one of said plurality of input lines when a signal on said enable port has a second state, said output port providing to said programmable interconnect a signal related to a signal present on said one of said plurality of input lines when said signal on said enable port last had said first state.

17. A programmable connector as in claim 13 or 14 comprising an external pin connected to at least one of said plurality of input lines.

18. A programmable connector as in claim 1, 8 or 13 further comprising means for segmenting at least one of said at least one interconnect line comprising at least one controllable switching means located along said at least one interconnect line.

19. A programmable connector as in claim 1 or 13, in which said means for applying is a transistor having one current carrying terminal connected to said first voltage supply, another to said interconnect line and its control terminal connected to said programmable control means.

20. A programmable connector as in claim 19 in which said transistor is an N-channel FET and said programmable control means comprises:
   a NAND gate having an output terminal connected to said control terminal of said transistor, and
   at least two input terminals, each receiving input from an output terminal of a programmable logic gate,
      one said programmable logic gate having an input terminal connected to said I/O line and another input terminal connected to a memory cell which determines whether said logic gate will pass a signal from said I/O line to said NAND gate, and
      another said programmable logic gate having an input terminal connected to receive the complement of a signal on said I/O line and another input terminal connected to a memory cell which determines whether said another logic gate will pass said complement of said signal from said I/O line to said NAND gate.

21. A programmable connector for a programmable logic device comprising:
   at least one I/O line;
   at least one interconnect line;
   means for segmenting at least one of said at least one interconnect line comprising at least one controllable switching means located along said at least one interconnect line;
   at least one programmable interconnect corresponding to one of said at least one I/O line and one of said at least one interconnect line, each of said at least one programmable interconnect comprising:
      means for applying a first voltage to said interconnect line, and
      programmable control means for controlling said means for applying a first voltage, said programmable control means being programmable to at least a first state such that in said first state said mean for applying a first voltage provides said first voltage to said corresponding interconnect line in response to a first signal on said corresponding I/O line and provides a high impedance to said corresponding interconnect line in response to a second signal on said corresponding I/O line; and
   means for providing a second voltage to each of said at least one interconnect line on which there is no first voltage being placed by any of said means for applying a first voltage.

22. A programmable connector for a programmable logic device comprising:
   at least one I/O line;
   at least one interconnect line;
   at least one programmable interconnect corresponding to one of said at least one I/O line and one of said at least one interconnect line, each of said at least one programmable interconnect comprising:
      means for applying a first voltage to said interconnect line, and
      programmable control means for controlling said means for applying a first voltage, said programmable control means being programmable to at least a first state such that in said first state said means for applying a first voltage provides said first voltage to said corresponding interconnect line in response to a first signal on said corresponding I/O line and provides a high impedance to said corresponding interconnect line in response to a second signal on said corresponding I/O line; and
   a latch inserted between said I/O line and said programmable interconnect, said latch comprising a data port connected to said I/o line, an enable port, and an output port connected to said programmable interconnect, said output port being connected to said I/O line when a signal on said enable port has a first state and said output port being disconnected from said I/O line when a signal on said enable port has a second state, said output port providing to said programmable interconnect a signal related to a signal present on said I/O line when said signal on said enable port last had said first state; and
   means for providing a second voltage to each of said at least one interconnect line on which there is no first voltage being placed by any of said means for applying a first voltage.

23. A programmable connector as in claim 21 or 22 in which said programmable control means is further programmable to at least a second state such that in said second state said means for applying a first voltage provides said first voltage to said corresponding interconnect line in response to said second signal on said I/O line and provides a high impedance to said corresponding interconnect line in response to said first signal on said corresponding I/O line.

24. A programmable connector as in claim 21 or 22 in which said programmable control means is further programmable to a state in which said means for applying a first voltage provides a high impedance to said corresponding interconnect line in response to said both first and second signals on said corresponding I/O line.

25. A programmable connector for a programmable logic device comprising:

a plurality of I/O lines;
at least one interconnect line;
a plurality of programmable interconnects, each corresponding to at least one of said I/O lines and one interconnect line, each of said programmable interconnects comprising:
  means for applying a first voltage to said interconnect line;
  control means for controlling said means for applying a first voltage, said control means being controlled by a signal on said at least one I/O line,
  means for programmably applying a signal present on one of said at least one interconnect line to one of said plurality of I/O lines, and
  means for programmably applying the complement of said signal present on said one of said at least one interconnect line to said one of said plurality of I/O lines; and
means for providing a second voltage to each of said at least one interconnect line on which there is no first voltage being placed by any of said means for applying a first voltage.

26. A programmable connector for an integrated circuit comprising:
a plurality of I/O lines;
at least one interconnect line;
a plurality of programmable interconnects, each of which corresponds to one of said I/O lines and one of said at least one interconnect line;
means for operating said at least one programmable interconnect on one of three modes, comprising:
  means for, in a first mode, providing a high impedance to said corresponding interconnect line in response to a high signal on said corresponding I/O line, and providing a first constant voltage to said corresponding interconnect line in response to a low signal on said corresponding I/O line;
  means for, in a second mode, providing a high impedance to said corresponding interconnect line in response to a low signal on said corresponding I/O line, and providing said first constant voltage to said corresponding interconnect line in response to a high signal on said corresponding I/O line; and
  means for, in a third mode, providing one of a signal present on one of said at least one interconnect line to one of said plurality of I/O lines, and the complement of said signal present on said one of said at least one interconnect line to said one of said plurality of I/O lines.

27. A programmable connector for a programmable logic device comprising:
at least one I/O lines;
at least one interconnect line;
means for segmenting at least one of said at least one interconnect line comprising at least one controllable switching means located along said at least one interconnect line;
at least one programmable interconnect, each corresponding to at least one of said at least one I/O line and one interconnect line, each of said at least one programmable interconnect comprising:
  means for applying a first voltage to said interconnect line;
  control means for controlling said means for applying a first voltage, said control means being controlled by a signal on said at least one I/O line; and
  means for providing a second voltage to each of said at least one interconnect line on which there is no first voltage being placed by any of said means for applying a first voltage.

28. A programmable connector for a programmable logic device comprising:
at least one I/O line;
at least one interconnect line;
at least one programmable interconnect, each corresponding to at least one of said at least one I/O line and one interconnect line, each of said at least one programmable interconnect comprising:
  means for applying a first voltage to said interconnect line;
  control means for controlling said means for applying a first voltage, said control means being controlled by a signal on said at least one I/O line; and
  means for providing a second voltage to each of said at least one interconnect line on which there is no first voltage being placed by nay of said means for applying a first voltage;
said programmable connector further comprising a latch inserted between said I/O line and said programmable interconnect, said latch comprising a data port connected to said I/O line, an enable port, and an output port connected to said programmable interconnect, said output port being connected to said I/O line when a signal on said enable port has a first state and said output port being disconnected from said I/O line when a signal on said enable port has a second state, said output port providing to said programmable interconnect a signal related to a signal present on said I/O line when said signal on said enable port last had said first state.

29. A programmable connector for a programmable logic device comprising:
at least one I/O line;
at least one interconnect line;
means for segmenting at least one of said at least one interconnect line comprising at least one controllable switching means located along said at least one interconnect line;
at least one programmable interconnect, each corresponding to at least one of said at least one I/O line and one interconnect line, each of said at least one programmable interconnect comprising:
  an N-channel FET transistor having one current carrying terminal connected to said first voltage supply and another to said interconnect line,
  control means for controlling said transistor, comprising:
    a NAND gate having an output terminal connected to said control terminal of said transistor, and at least two input terminals, each receiving input from an output terminal of a programmable logic gate,
    one said programmable logic gate having an input terminal connected to said I/O line and another input terminal connected to a memory cell which determines whether said logic gate will pass a signal from said I/ line to said NAND gate, and
    another said programmable logic gate having an input terminal connected to receive the complement of a signal on said I/O line and another input terminal connected to a memory cell which determines whether said another logic gate will pass said complement of said signal from said I/O line to said NAND gate; and means for providing a second voltage to each of said at least one interconnect line on which there is no first voltage being placed by any of said means for applying a first voltage.

* * * * *

UNITED STATES PATENT AND TRADEMARK OFFICE
CERTIFICATE OF CORRECTION

PATENT NO. : 5,140,193            Page 1 of 2
DATED : August 18, 1992
INVENTOR(S) : Ross H. Freeman (Deceased) et al It is certified that error appears in the above-indentified patent and that said Letters Patent is hereby corrected as shown below:

Col. 6, line 39, "$\bar{B}$on" should read --$\bar{B}$ on--.

Col. 6, line 45, "$O_C$(i.e." should read --$O_C$ (i.e.--.

Col. 6, line 52, "$\bar{A}$on" should read --$\bar{A}$ on--.

Col. 8, line 59, "P10" should read --$PI_0$--.

Col. 9, line 20, "signal" should read --signals--.

col. 9, line 38, "Ln" should read --$L_n$--.

Col. 9, line 44, "$I_1 - I_n$." should read --$L_1 - L_n$.--.

Col. 10, line 9-10, "$O_A - _2 - O_{D2}$" should read --$O_{A2} - O_{D2}$--.

Col. 11, line 25, after "line;" insert --and--.

Col. 12, line 8, after "claim 1" insert --or 8--.

Col. 14, line 37, "I/o" should read --I/O--.

UNITED STATES PATENT AND TRADEMARK OFFICE
CERTIFICATE OF CORRECTION

PATENT NO. : 5,140,193
DATED      : August 18, 1992
INVENTOR(S): Ross H. Freeman (Deceased) et al It is certified that error appears in the above-indentified patent and that said Letters Patent is hereby corrected as shown below:

Col. 15, line 32, "on" should read --in--.

Col. 16, line 23, "nay" should read --any--.

Col. 16, line 64, "I/" should read --I/O--.

Signed and Sealed this

Seventh Day of December, 1993

Attest:

BRUCE LEHMAN

Attesting Officer        Commissioner of Patents and Trademarks